United States Patent
Caci et al.

(10) Patent No.: US 7,272,468 B2
(45) Date of Patent: *Sep. 18, 2007

(54) SELF-SUSTAINING ENVIRONMENTAL CONTROL UNIT

(75) Inventors: J. Claude Caci, Owego, NY (US); David L. Vos, Apalachin, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/034,524

(22) Filed: Jan. 12, 2005

(65) Prior Publication Data

US 2005/0128689 A1    Jun. 16, 2005

Related U.S. Application Data

(62) Division of application No. 10/340,475, filed on Jan. 10, 2003, now Pat. No. 7,203,574.

(51) Int. Cl.
*G05B 15/00* (2006.01)
*H05K 7/20* (2006.01)

(52) U.S. Cl. ..................... 700/276; 361/688

(58) Field of Classification Search .......... 700/276; 361/679, 600, 688, 686, 680, 687, 695, 691; 165/104, 33; 206/576; 235/400
See application file for complete search history.

(56) References Cited

U.S. PATENT DOCUMENTS

| | | | |
|---|---|---|---|
| 4,592,602 A | 6/1986 | Kuster et al. | |
| 4,727,934 A * | 3/1988 | Eckel et al. | 361/686 |
| 4,769,296 A * | 9/1988 | Sterzel | 429/12 |
| 5,216,579 A | 6/1993 | Basara et al. | |
| 5,226,540 A * | 7/1993 | Bradbury | 361/680 |
| 5,390,081 A | 2/1995 | St. Pierre | |
| 5,443,312 A | 8/1995 | Schluter | |
| 5,684,671 A | 11/1997 | Hobbs et al. | |
| 5,781,410 A | 7/1998 | Keown et al. | |
| 5,783,932 A | 7/1998 | Namba et al. | |
| 5,801,632 A * | 9/1998 | Opal | 361/688 |
| 5,808,866 A | 9/1998 | Porter | |
| 5,934,079 A | 8/1999 | Han et al. | |
| 5,943,211 A | 8/1999 | Havey et al. | |
| 5,944,602 A | 8/1999 | Grundy | |
| 6,032,474 A * | 3/2000 | Dale et al. | 62/239 |
| 6,088,225 A | 7/2000 | Parry et al. | |
| 6,104,003 A | 8/2000 | Jones | |
| 6,127,663 A | 10/2000 | Jones | |
| 6,151,212 A | 11/2000 | Schwenk et al. | |
| 6,199,701 B1 | 3/2001 | Bodini | |
| 6,215,658 B1 | 4/2001 | Bodini | |

(Continued)

*Primary Examiner*—Leo Picard
*Assistant Examiner*—Steven R. Garland
(74) *Attorney, Agent, or Firm*—Oliff & Berridge, PLC

(57) ABSTRACT

A method and apparatus for housing an electronic device are provided. The apparatus includes an environmentally sealed chamber to protect the electronic device from harsh environments. The environmental conditions of the chamber are controllable using environmental controls which are controlled by digital processor with a stored program coupled with sensors. The digital processor may also control the application of power from an external interface. The apparatus also includes a self-contained power source running from a primary fuel. A control system is provided for managing power production and energy storage to maintain continuity of environmental conditions.

6 Claims, 14 Drawing Sheets

U.S. PATENT DOCUMENTS

| | | |
|---|---|---|
| 6,272,016 B1 | 8/2001 | Matonis et al. |
| 6,294,277 B1 | 9/2001 | Ueno et al. |
| 6,301,095 B1 | 10/2001 | Laughlin et al. |
| 6,330,152 B1 * | 12/2001 | Vos et al. .................... 361/688 |
| 6,442,030 B1 | 8/2002 | Mammoser et al. |
| 6,462,944 B1 | 10/2002 | Lin |
| 6,474,410 B1 * | 11/2002 | Minich et al. ......... 165/104.33 |
| 6,532,152 B1 * | 3/2003 | White et al. ................. 361/692 |
| 2002/0020682 A1 | 2/2002 | Broome |
| 2002/0025460 A1 | 2/2002 | Horiguchi et al. |
| 2002/0075656 A1 | 6/2002 | Hastings et al. |
| 2002/0113529 A1 | 8/2002 | Pryor et al. |
| 2002/0114985 A1 | 8/2002 | Shkolnik et al. |
| 2002/0127451 A1 | 9/2002 | Cao et al. |
| 2002/0153419 A1 * | 10/2002 | Hall ........................... 235/400 |
| 2003/0023888 A1 * | 1/2003 | Smith et al. ................. 713/300 |

* cited by examiner

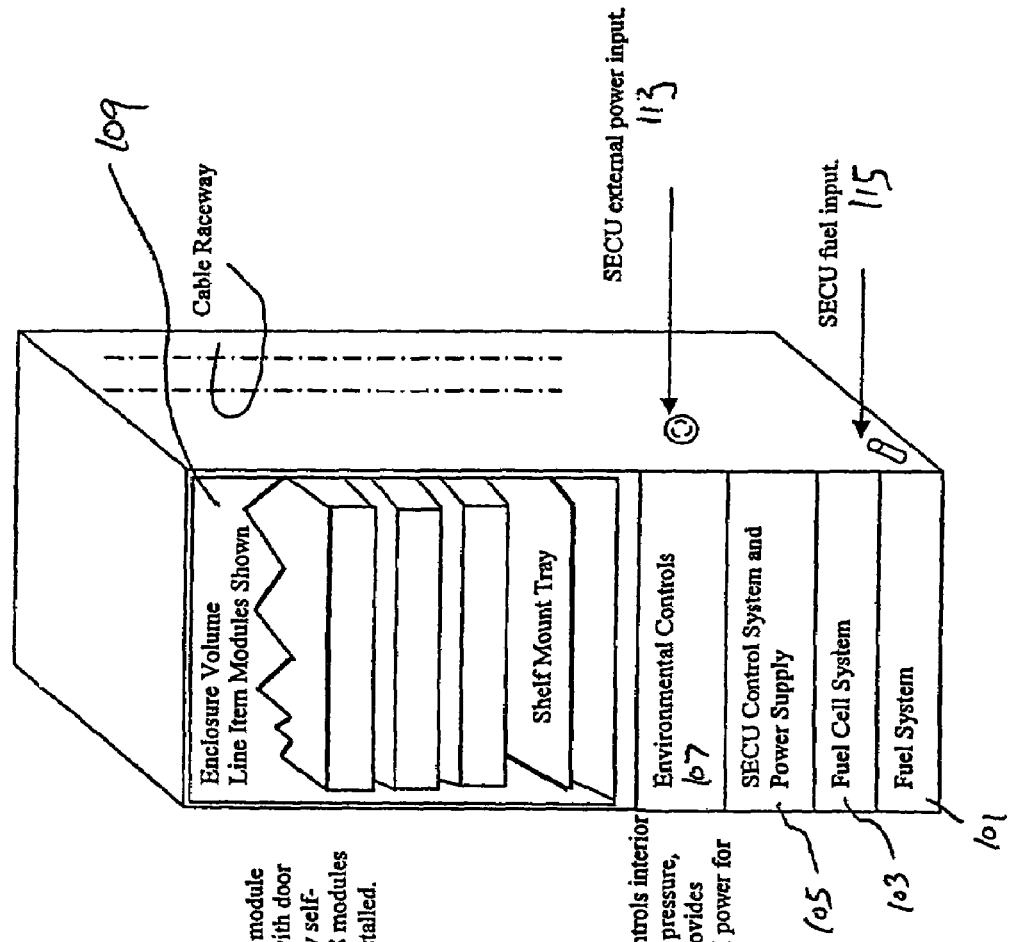
Figure 1B Self-contained Environmental Control Unit for COTS Line Modules Figure 4 SECU System Diagram Figure 8 Waste Level Management

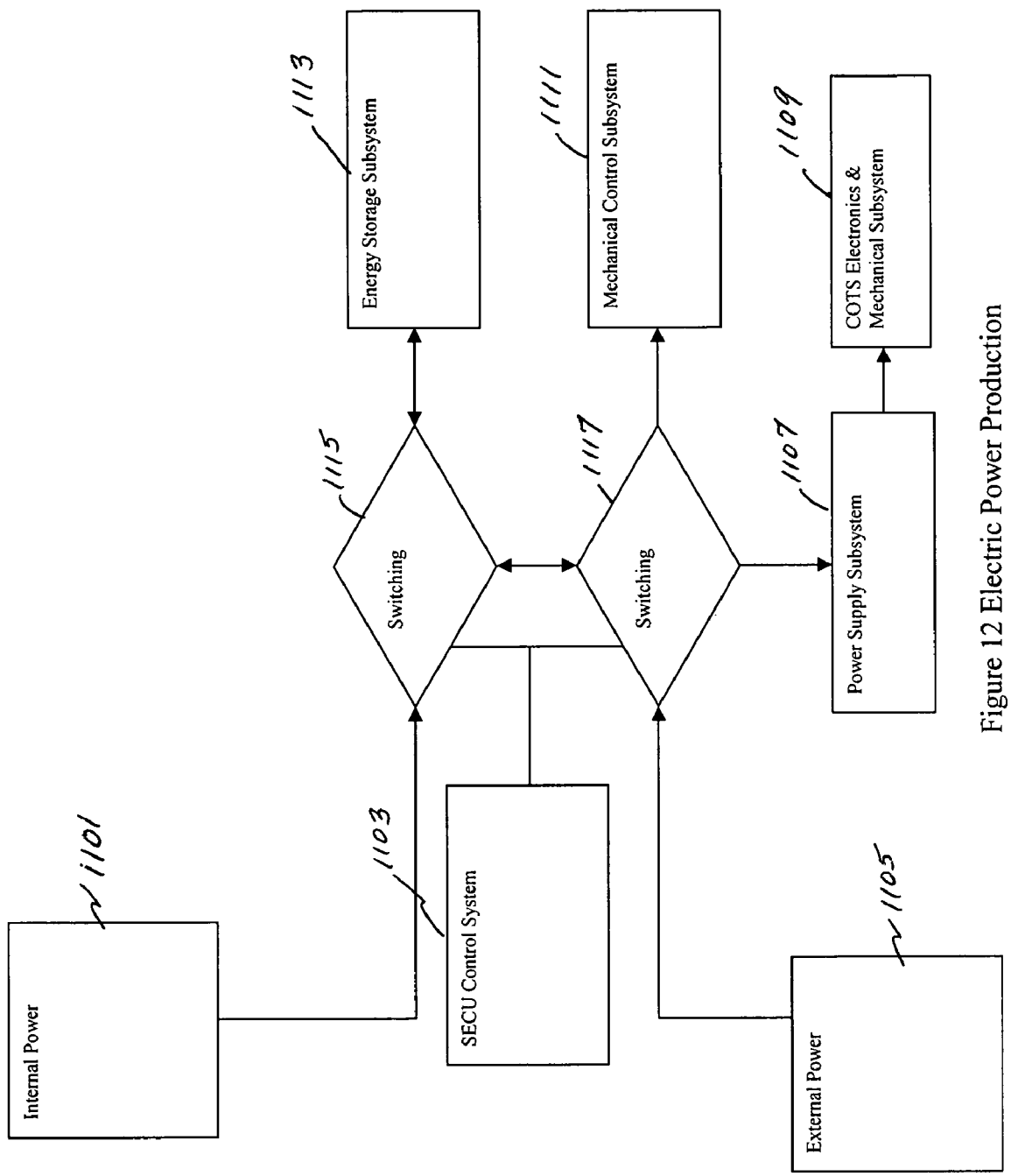
Figure 12 Electric Power Production

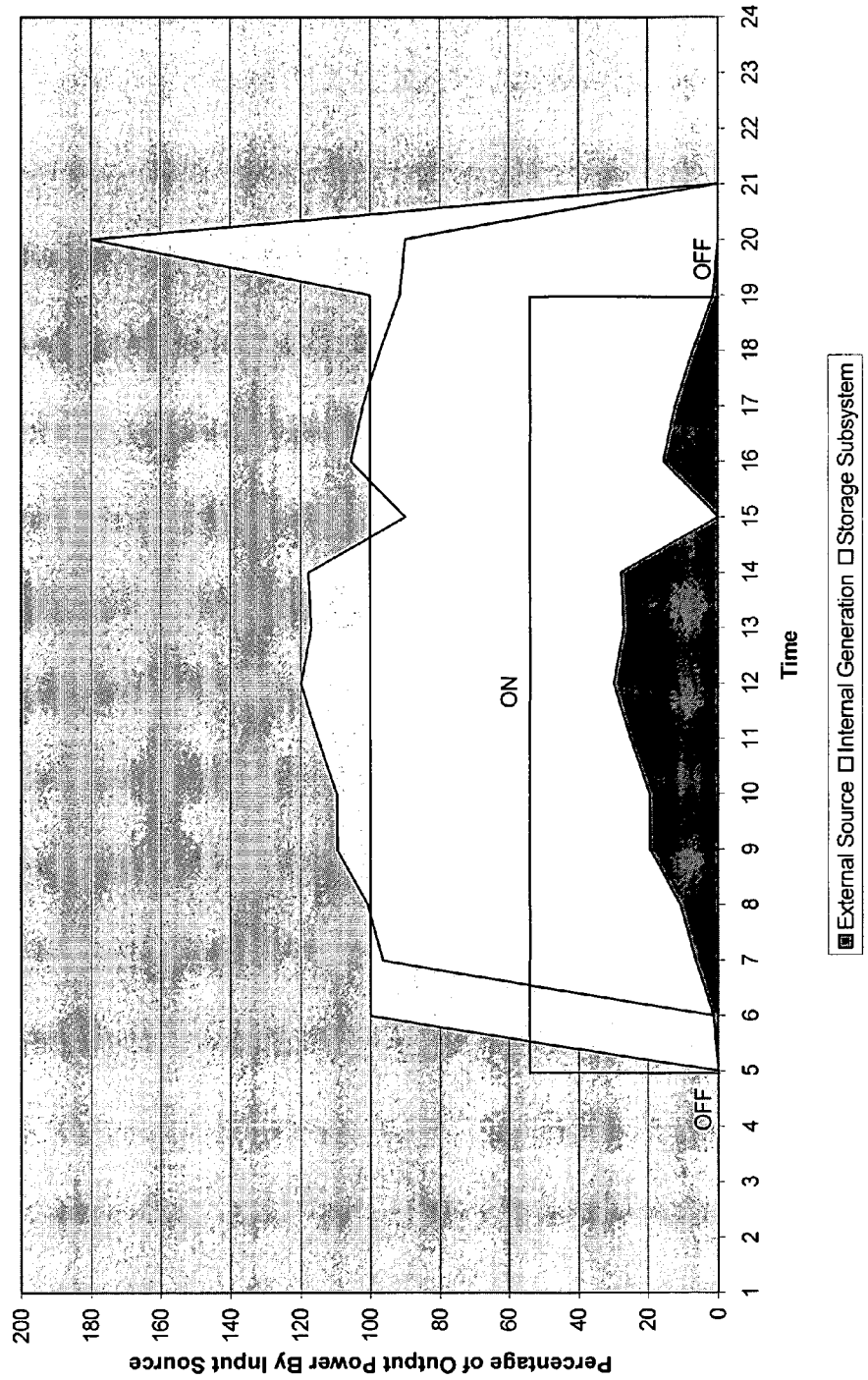
Figure 13 Electric Power Production Management Example

SELF-SUSTAINING ENVIRONMENTAL CONTROL UNIT

RELATED APPLICATIONS

This application is a divisional of U.S. patent application Ser. No. 10/340,475, filed Jan. 10, 2003 now U.S. Pat. No. 7,203,574, entitled SELF-SUSTAINING ENVIRONMENTAL CONTROL UNIT.

FIELD OF THE INVENTION

The invention relates to a method and apparatus for mounting electronic devices and, more particularly, to protecting electronic devices from harsh environments.

BACKGROUND OF THE INVENTION

Often it is desirable to use commercial off the shelf (COTS) electronic devices, such as high speed computers, in harsh environments. For example, it may be desirable to use such electronic device in locations where environmental conditions, such as temperature, humidity, and air pressure, may not be suitable for electronic devices and power to sustain the environment may not be readily available.

Mechanically controlled Environmental Control Units (ECUs) exist which are capable of controlling some environmental conditions, such as temperature, and can protect enclosed contents, such as COTS electronic devices, from harsh conditions. However, such ECUs are without a digital programmable controller and require an external power source. These ECUs cannot operate without electric power from a power grid or vehicle and are not capable of modifying environmental control or managing internal and external power from a digital programmable controller.

SUMMARY OF THE INVENTION

In one aspect of the invention, an apparatus for housing an electronic device is provided. The apparatus comprises an environmentally sealed chamber having environmental conditions therein, wherein the chamber adapted to receive the device, environmental controls that control the environmental conditions, and a digital controller for monitoring the environmental conditions of the chamber and controlling the environmental controls.

In one embodiment, the sealed chamber is adapted to house at least one of the group comprising electronic circuit boards, electronic modules, and electronic units. In another embodiment, the apparatus further comprises a self contained-power source configured to provide power to the electronic device. In yet another embodiment, the digital controller is further configured to regulate power generated by the self-contained power source. The digital controller may also be configured to regulate power received from an external power source.

In another embodiment, the apparatus further comprises a plurality of sensors configured to detect environmental conditions and provide information regarding the environmental conditions to the digital controller. The environmental controls may include mechanical controls configured to alter environmental conditions inside the chamber, wherein the mechanical controls are operated under control the digital controller based, at least in part, on the information received from the plurality of sensors. In yet another embodiment, the digital controller is configured to control the environmental controls based, at least in part, on a standard operational profile which specifies desired environmental conditions. In another embodiment, the apparatus further comprises an operator interface configured to provide information from the digital controller to an operator through an input/output device and to allow an operator to monitor and control the apparatus. The operator interface further comprises a data network interface configured to allow the operator to remotely monitor and control the apparatus.

In another aspect of the invention, a method for housing an electronic device is provided. The method comprises acts of providing an environmentally sealed chamber having environmental conditions therein, the chamber adapted to receive the device, providing environmental controls that control the environmental conditions, and providing a digital controller for monitoring the environmental conditions and controlling the environmental controls. In one embodiment, the method further comprises an act of providing a self-contained power source configured to generate power for controlling the environmental controls. The digital controller may also regulate power generated by the self-contained power source and may regulate power received from an external power source. In another embodiment, the method may further comprise an act of providing a plurality of sensors configured to detect environmental conditions and provide information regarding the environmental conditions to the digital controller.

In yet another aspect of the invention a method for housing an electronic device is provided. The method comprises acts of housing an electronic device in an environmentally sealed chamber having environmental conditions therein, controlling the environmental conditions using environmental controls, and monitoring the environmental conditions of the chamber and controlling the environmental controls using a digital controller. In one embodiment, the method further comprises an act of using a self-contained fuel source to provide power for controlling the environmental conditions and for powering the electronic device. The method further comprises an act of regulating the power generated by the power source and an act of storing unused power generated by the power source. In another embodiment, the method further comprises an act of adjusting the environmental conditions inside the chamber based, at least in part, on input received from a plurality of sensors inside the chamber.

In yet another aspect of the invention, an apparatus for housing an electronic device is provided. The apparatus comprises an environmentally sealed chamber having environmental conditions therein, wherein the chamber is adapted to receive the device, environmental controls for controlling the environmental conditions, and a self-contained power source adapted to generate power for controlling the environmental conditions of the chamber. In one embodiment, the sealed chamber is adapted to house at least one of the group comprising electronic circuit boards, electronic modules, and electronic units. In another embodiment, the apparatus further comprises a digital controller for monitoring the environmental conditions and controlling the environmental controls. The digital controller may be configured to regulate power generated by the self-contained power source. The digital controller may also be configured to regulate power received from an external power source. In one embodiment, the apparatus further comprises a plurality of sensors configured to detect environmental conditions and provide information regarding the environmental conditions to the digital controller. The environmental controls may include mechanical controls configured to alter environmental conditions inside the chamber, wherein the mechanical controls are operated under control the digital controller based, at least in part, on the information received from the plurality of sensors.

Each of the above disclosed aspects and embodiments may be used and applied separately and independently, or may be applied in combination. Description of one aspect of the invention is not intended to be limiting with respect to other aspects of the invention. These and other aspects and embodiments of the invention are described below in greater detail.

BRIEF DESCRIPTION OF THE DRAWINGS

FIG. 1B is a block diagram of a self-sustaining environmental control unit for COTS electronics at the module level, according to one embodiment of the invention;

FIG. 12 is a block diagram of power distribution subsystem according to one embodiment of the invention;

FIG. 13 is a power management timeline for power management in a self-sustaining environmental control unit, according to one embodiment of the invention.

DETAILED DESCRIPTION

Figure 1A:
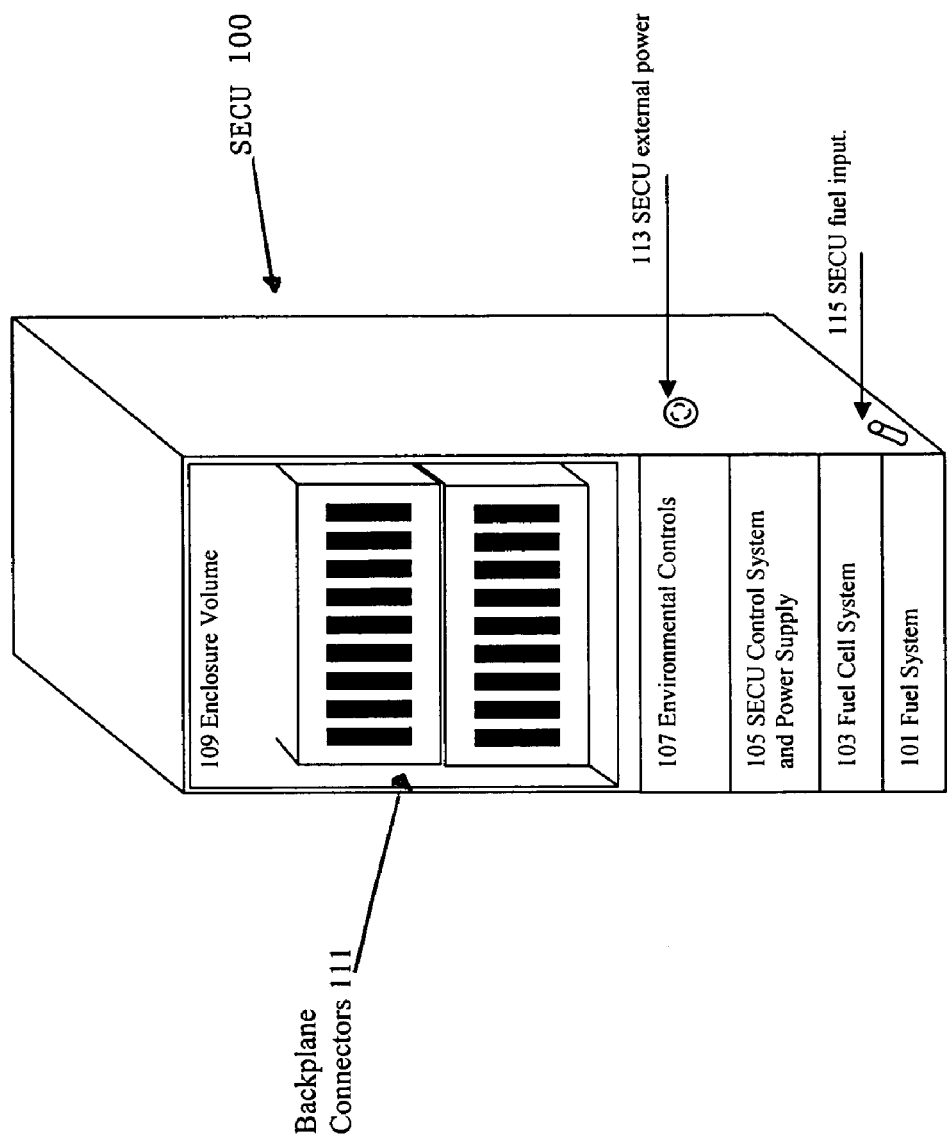
FIG. 1A is a block diagram of a self-sustaining environmental control unit for COTS electronics at the circuit board level, according to one embodiment of the invention.

As the clock speeds of electronic components, such as microprocessors, increase and the size of the semiconductor junctions of such components have decreased, the electronic devices have become more sensitive to environmental conditions, such as temperature. For example, some commercial-off-the-shelf (COTS) computer circuit boards operate in a temperature range from 10 degrees Celsius to 40 degrees Celsius. As will be discussed below in greater detail, COTS electronics may come in a variety of forms. For example, COTS electronics may be in circuit-board-level form, module-level form, or unit form.

It is often desirable to operate these electronic devices in harsh environments. For example, some military applications may require use of electronics in the field. Other applications may include cellular networks, remote broadcasting equipment, and homeland security applications, in which electronic devices must be operated from a vehicle, such as a remote broadcasting studio, mobile shelters, a motor home, or an airplane. Additionally, these harsh environments often lack a power source for supplying power to the electronic devices.

A self-sustaining environmental control unit (SECU) may be provided, which runs directly on fuel. For example, when external power is not generally available or when a backup power source is required, then a SECU may be configured to run directly on fuel in conjunction with or exclusively from natural energy conversion subsystems. The SECU includes a digital programmable controller with sensors to manage the environmental conditions of the electronics contained within the SECU. The digital programmable controller may run a stored program and may have an input/output interface for an operator to read conditions, obtain a history of conditions, modify variables and control environmental conditions. Thus, an operator may use the SECU to function with COTS electronics in harsh environments where external electric power, such as national electric grid power or external generator is not available. The digital programmable controller may match the electric power load to the available power. It may also anticipate future electric loads from sensor trend projections and configures power generating equipment to provide the power at the time it is needed.

One example of self-contained power source that may be used to operate the SECU directly from fuel is a fuel cell. Any type of fuel cell, such as a permeable exchange membrane (PEM) fuel cell, a solid oxide fuel cell (SOFC) or a direct methanol fuel cell (DMFC), may be used. Such fuel cells are capable of generating electricity to power from chemical reactions. Unlike internal combustion engines, fuel cells produce little noise, are environmentally friendly, and produce little heat, allowing them to be used in close proximity to electronic equipment. Also because fuel cells are direct current devices, they have low electromagnetic radiation, which is also desirable for operation close to electronic equipment.

Power sources other than fuel cells may also be used. For example, solar power generated from solar panels may be used, or wind power may be used. It should be appreciated that any electric power source which is compatible with electronics and people may be used.

One embodiment of the invention, in which a SECU is powered by one or more fuel cells, is shown in FIG. 1A. It should be appreciated that other power sources could be used in place of the fuel cells. For example, solar panels or wind turbines may be used. FIG. 1 shows a SECU 100, which includes a fuel system 101 which stores fuel, such as hydrogen or methanol, for the fuel cell. It should be appreciated that the type of fuel stored by fuel system 101 will depend on the type of power source used by the SECU. SECU 100 also includes a fuel input 115 for providing fuel to the SECU.

Fuel Cell system 103 includes a fuel cell stack for generating electricity using fuel from fuel system 101. Fuel cells may often not be capable of powering electronic loads by themselves. For example, fuel cells may have a time lag from when power is called for to when it is available. Furthermore, the supply voltage may vary over a wide range. At cold temperatures, a long period of time may be consumed before full power is available. Additionally, the fuel cell may need to generate power to heat itself in cold temperatures and cool itself in hot temperatures. Moreover, because fuel cells use oxygen in the air in a chemical reaction to generate electricity, air pressure may affect the supply and concentration of oxygen available to the fuel stack. Furthermore, the efficiency of certain types of fuel cells, such as PEM fuel cells, may be affected by impurities in the air. Also, impurities in the fuel provided to the fuel cell may also affect fuel cell efficiency. Thus, a control system 105 is provided to regulate the power production of the fuel cell, interface with any external power sources, and apply power to the electrical load. Control system 105 may use stored power operational curves and monitor and chart internal environmental conditions to anticipate future power needs.

SECU 100 also includes environmental controls 107 which control the environmental conditions inside enclosure 109 of SECU 100. Environmental controls may include for example, heating controls, ventilation controls, and air conditioning controls. In aviation applications, the SECU may include additional controls for regulation of air pressure and humidity. SECU 100 also includes an enclosure 109 for housing electronic devices. Enclosure 109 is environmentally sealed. An example of an enclosure suitable for use is disclosed by Vos, et. al. in U.S. Pat. No. 6,330,152, which is hereby incorporated by reference in its entirety. Enclosure 109 may include backplane connectors 111 for mechanically mounting COTS electronic devices, such as circuit boards. However, many other ways of mounting electronic devices in enclosure 109 may be used, such as module-level mounting of electronic devices. For example, FIG. 1B shows another embodiment, in which enclosure 109 includes shelves for mounting electronic modules. A module may be an encapsulation of one or more circuit boards with embedded cooling capability. The encapsulation may protect the electronics from adverse air pressure changes and shock and vibration. Using module-level COTS devices in the SECU may be useful, for example, in aviation applications where the enclosure 109 may be opened for reconfiguration during operation of the COTS devices. The module may receive power from a cable raceway in SECU 100. The module surface may include a portion for heat exchange, a portion for cables and connectors, and a portion for mechanical mounting. SECU 100 may also include an external power interface 113, for interfacing with other power sources such as external grid power, a solar power source, or a wind power source.

Figure 2:
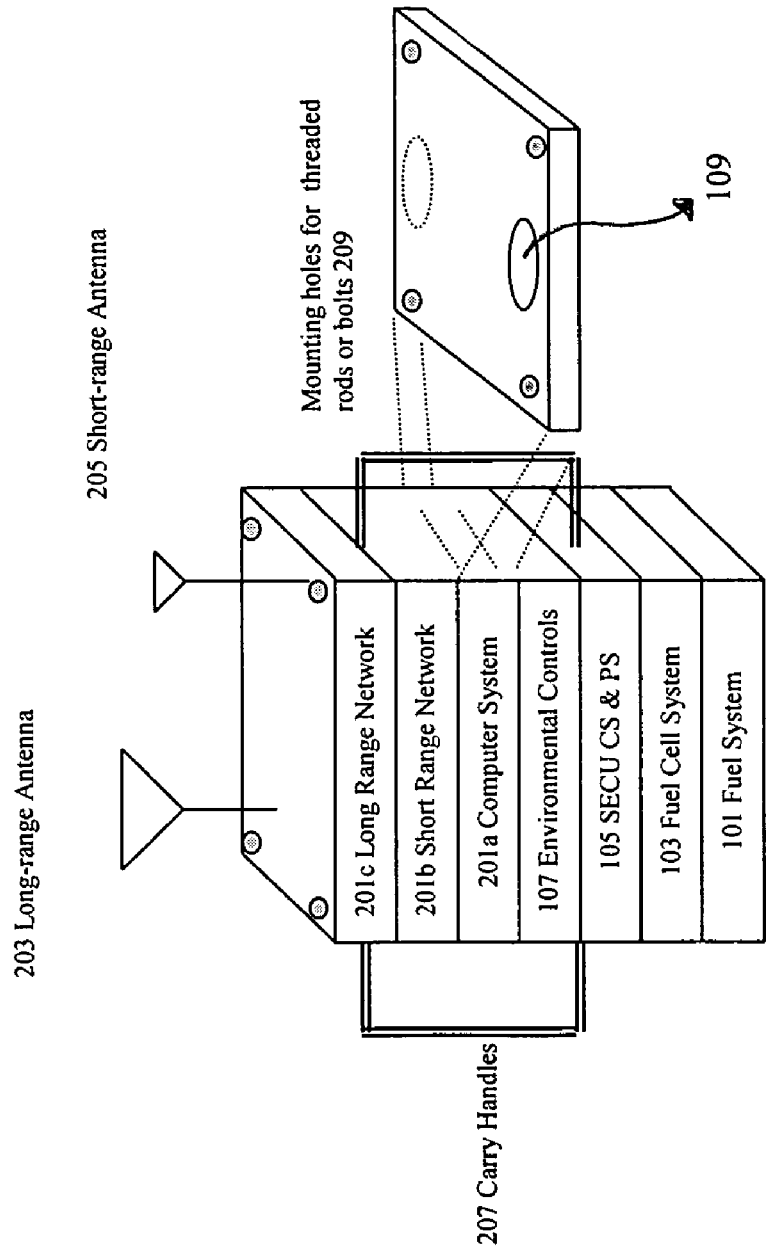
FIG. 2 is a block diagram of a self-sustaining environmental control unit, for COTS electronics at the unit level according to one embodiment of the invention.

Another embodiment of the invention is shown in FIG. 2. FIG. 2 shows a mobile SECU 200 which is designed to withstand the elements of harsh environments directly. Similar to the embodiment of FIG. 1, FIG. 2 includes a fuel system 101, a fuel cell system 103, a control system 105, and environmental controls 107. SECU 200 also includes a rack for mounting different modules. Modules may be hardened to withstand environments on their own so that an enclosure is not needed to house the modules. All heating, cooling, and shock mounting is incorporated inside each modules. Modules may be mounted and replaced to customize SECU 200 for a particular purpose. SECU 200 shown in FIG. 2 is customized as a node server for a wireless repeater data network, intended to server smaller units (not shown) from a short range link connected through a long range link in SECU 200. As such, the modules in FIG. 2 include a computer system 201a, a short range network radio 201b, and a long range network radio 201c. Radio signal carrying data from the long rage radio connect the server to an external network, while the short range radio connects nearby mobile units to the server. It should be appreciated that SECU 200 may be customized in many other different ways by using different modules, as the invention is not limited in this respect.

Modules may be standardized so they can be affixed structurally to one another. For example, a module may have four mounting holes at the module corners. A single threaded rod can be used to assemble the modules into a single structure. Alternatively, the modules could be bolted to one another in a cascaded arrangement.

As mentioned above, a module may be a self-contained encapsulation of one or more circuit boards. Each module may include a channel designed to move air across heat sensitive components. Air volume and temperature may be regulated by SECU 200. Sensors may be embedded in each module to allow SECU control system 105 to keep the right amount of conditioned air within each module. The modules may also have there own embedded cooling capability. For example, a solid-state heat pump can move thermal energy into and out of modules using heat sinks attached to the module surface. Alternatively, a small fan may impinge air on microchip heat sinks, increasing heat transfer capacity within the module. Air flow in SECU 200 can then remove heat from the other side of the module. A module may also include its own power supply. Electrical connections may be made by way of connectors mounted on one side of the module. Cable raceways of SECU 200 may provide power and signal paths between the modules.

Figure 3:
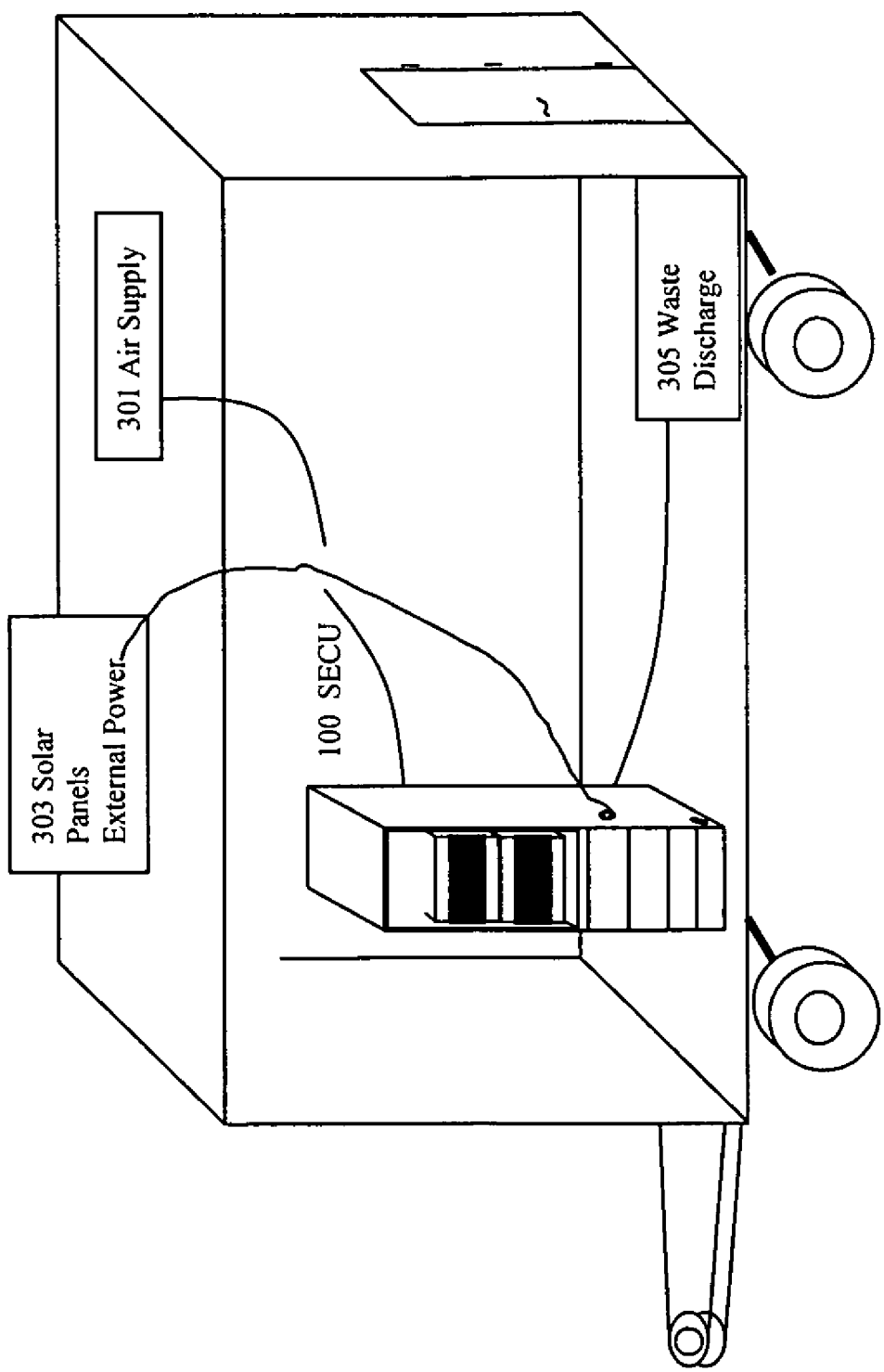
FIG. 3 is a block diagram of a self-sustaining environmental control unit in a mobile enclosure, according to one embodiment of the invention.

Another embodiment of the invention is depicted in FIG. 3. FIG. 3 illustrates a SECU 100 adapted for a mobile environment. In FIG. 3, a trailer provides mobility for the electronic equipment housed in SECU 100. The trailer may include an air intake 301 for providing air used by the fuel cells. Trailer 300 may also include another power source such as solar panels 300, which interface with the external power input of SECU 100 and a waste discharge unit used to hold waste discharged from the SECU.

It should be understood that the embodiment of FIG. 3 may be used in mobile environments other than a trailer. For example, the embodiment could be used in a truck, airplane or marine vessel. In addition, SECU 100 could also be installed in a cell tower or unmanned fixed shelter or building structure which is not designed for human habitation, lacking heat, ventilation, plumbing and external electric power. If, for example, the mobile environment in which the SECU is used is an airplane, solar panels may be replaced by the airplane's engines as a secondary power source. Alternatively, the airplane's engines may be the primary power source when the airplane is operating and the fuel cells may be the primary power source when the airplane is not operating. When the airplane is not operating, the interior will not be environmentally controlled. Thus, it is important for the fuel cell to provide the necessary power to hear or cool the electronic devices, as the interior of the airplane will be subject to external extremes. Additionally, the electronic devices may require humidification or drying. As a result, the fuel cell may provide power for the electronic equipment to operate even though the airplane crew is not present and engine power is not available. Thus, the SECU unit may improve aircraft performance by eliminating the need for the crew to boot start the system from a cold soak or cool the unit from a hot soak prior to applying power and brining up the system.

It should be appreciated however, that the exact physical form and location of each of the logical components shown in FIG. 3 may vary depending on the mobile environment in which it is situated.

Figure 4:
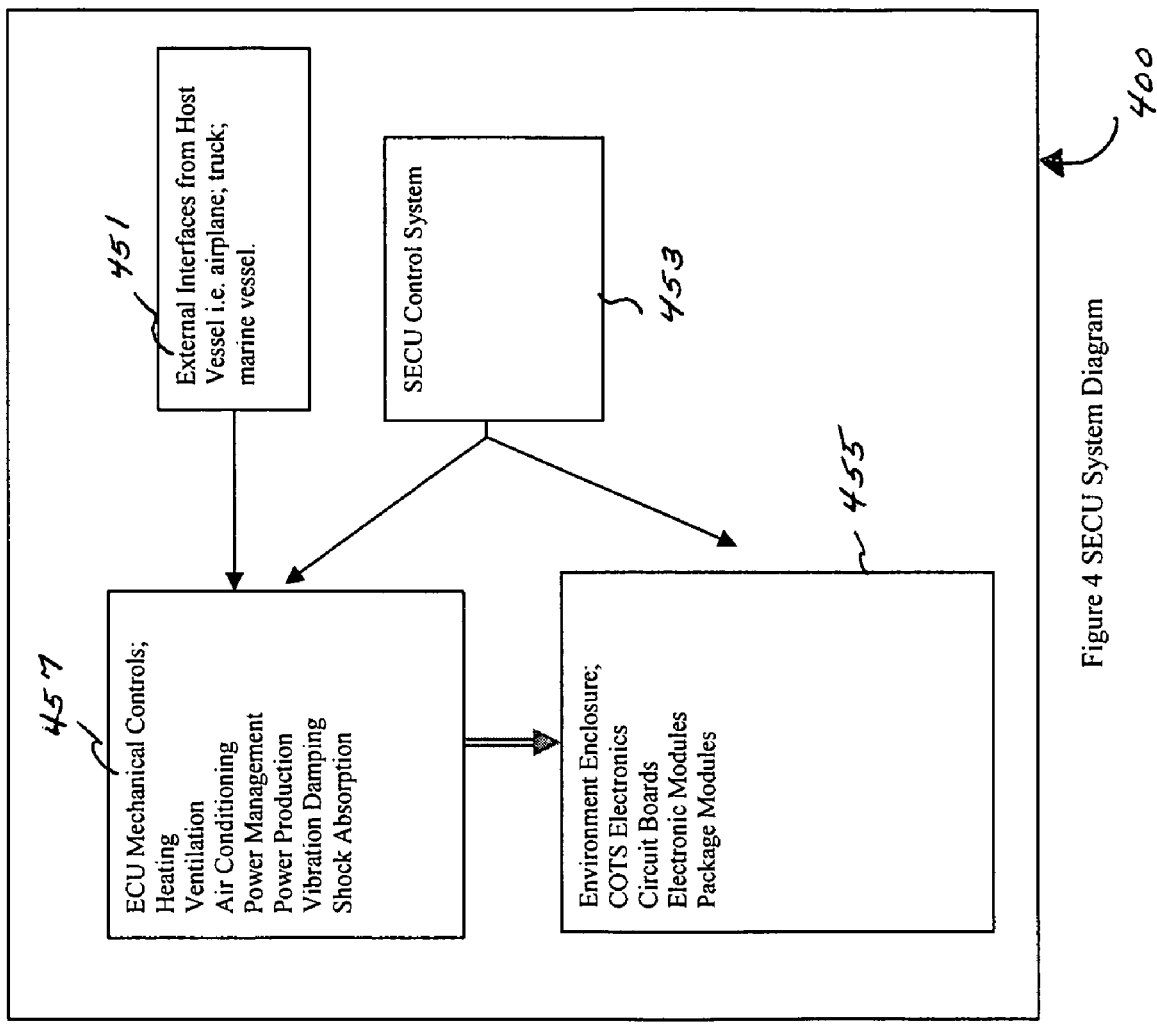
FIG. 4 is a logical diagram of the self-sustaining environmental control unit of FIG. 3.

A high-level logical system diagram of a SECU that is suitable for use in a mobile enclosure (e.g., the trailer of FIG. 3) is shown in FIG. 4. It should be appreciated that the system of FIG. 4 may be applied to many different types of mobile environments, such as, for example, those discussed above with respect to FIG. 3. It should also be appreciated that the exact physical form and location of each of the logical components shown in FIG. 4 may vary depending on the mobile environment in which it is situated.

FIG. 4 shows a SECU 400 which includes external interfaces 451, control system 453, environmental enclosure 455, and ECU mechanical controls 457. External interfaces 451 interface the mechanical controls 457 with the host vessel. For example, the host vessel could supply external power, water, or air to the mechanical controls 457 of SECU 400, using interfaces 451. It should be appreciated that the host vessel may be any type of vessel, such as an automobile, truck, tank, airplane, or marine vessel. The quality and quantity of the interfaces may be monitored by sensors of control system 453 as well as controlled by the control system. Thus, control system 453 may adjust, for example, the quality and quantity of internally generated power in response to the amount of externally generated power which is available. The power may then be supplied to the enclosure for heating, cooling, humidifying, or drying of the enclosure.

Figure 5:
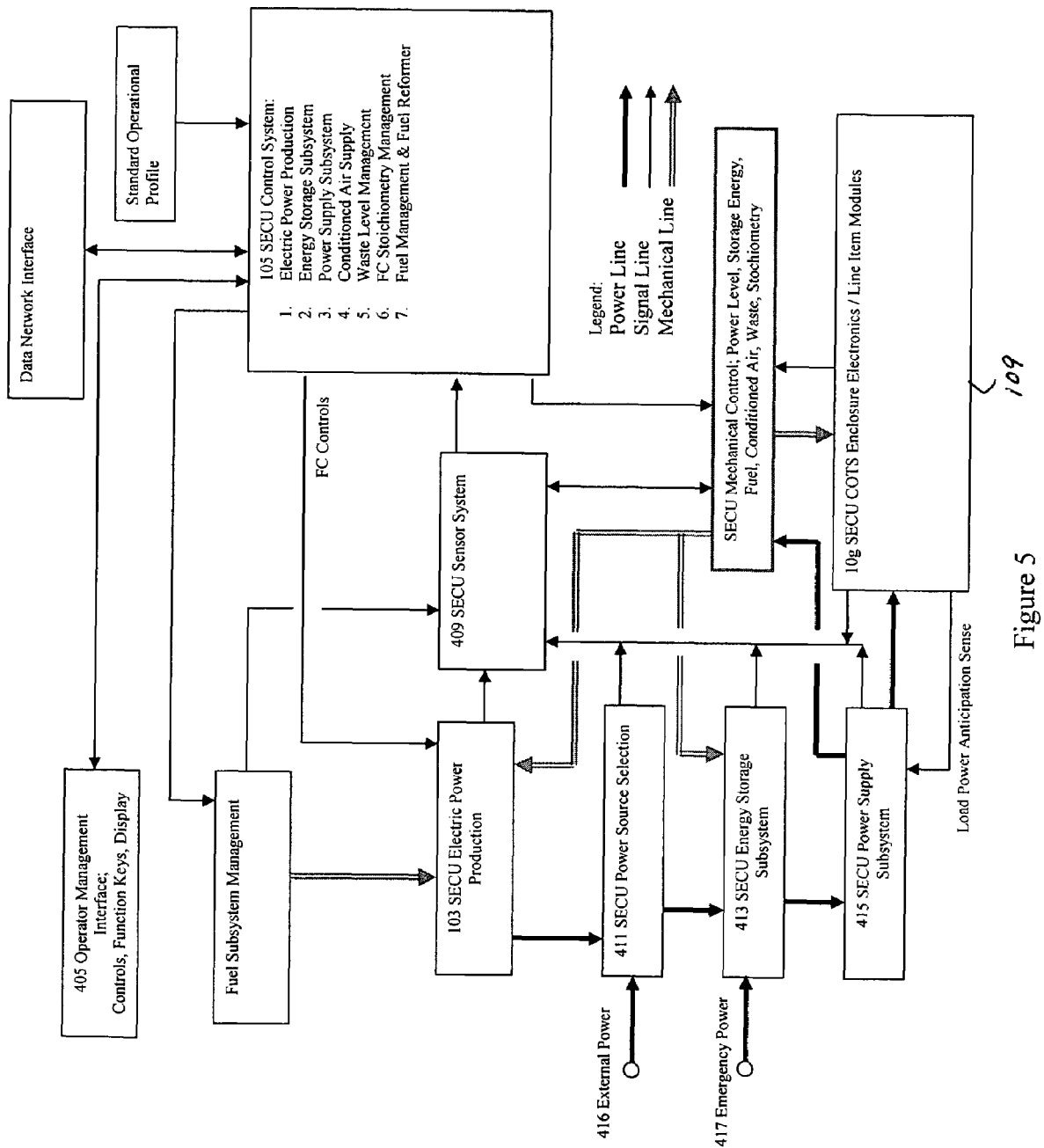
FIG. 5 is a block diagram of a control system for a self-sustaining environmental control unit, according to one embodiment of the invention.

FIG. 5 is a block diagram which illustrates generally the function of control system 105. Control system 105 includes a single board computer (SBC) 401 which executes control system software to process information received from a sensor subsystem 409 and make appropriate modifications to other components of control system 105 and the SECU. A user interface 405 allows a user to interact with the control system, and may include function keys, a display, or other controls. Network interface 407 allows SBC 401 to send and receive data over a network, so that SBC can be controlled or programmed remotely.

SBC 401 may be hardened circuitry, designed to operate in harsh environments. Thus, the SBC may operate outside the environmentally controlled enclosure of the SECU, although in practice the SBC may be located in enclosure 109 of the SECU. Accordingly, SBC 401 may be designed to have low computational performance requirements in exchange for rugged environmental performance. For example, suppose that the SECU includes fifty sensors, each of which needs to be strobed five times per second on average. An average sensor may require approximately four thousand machine-level instructions to be executed each time the sensor is strobed. Thus, an SBC which is capable of executing fifty million instructions per second (MIPS) may be adequate.

User interface 405 provides a system operator with access to control system 105. User interface 405 may include function keys and display which allow an operator to manage the control system. Also, user interface may include controls which allow an operator to manually override control system software and directly affect an operation of the SECU. Network interface 407 allows an operator to perform the same management operations remotely, using a data network.

Sensor subsystem 409 includes a plurality of sensors for monitoring various attributes of the SECU. Sensors may be located in any module or subsystem of the SECU, including fuel subsystem 101, power production subsystem 103, power source selection 411, energy storage subsystem 413, power supply subsystem 415, environmental controls 107, and enclosure 109. Such sensors may include, for example, sensors to monitor the environmental conditions (e.g., temperature, humidity, air pressure) of enclosure 109, fuel cell sensors for measuring air purity and fuel purity, sensors for monitoring the amount of energy stored by energy storage subsystem 413, sensors for monitoring the quantity of fuel stored by fuel system 101, and sensors for power management purposes, such as monitoring power quality. It should be appreciated that these types of sensors are given only by way of example as the invention is not limited in this respect.

A standard operational profile 403 is provided to SBC 401. The standard operational profile is a calibrated curve of operating points covering temperature, humidity and pressure and may be generated for a specific combination of power sources. For example, a profile may be generated for a DMFC with an external solar power interface. That is, the profile defines, for a particular combination of power sources, what power production should be for each power source to meet particular temperature, humidity, and pressure requirements, given the load of the electrical equipment. For example, in a PEM fuel cell an electrochemical stoichiometry relationship exits between fuel, oxidant (e.g., air) and electric power production. This relationship is sometimes referred to as a polarization curve. The control system may use such polarization curves as a reference for comparing current settings and determining what should be adjusted to bring the SECU operating point close to the standard operational profile.

FIG. 12 illustrates how power may be delivered to various subsystems of the SECU. Power may be generated internally from internal power source 1101 and may also be received from an external power source 1105. Stored power from energy subsystem 1113 may also be used to provide power to SECU subsystems and electronic devices. Control system 1103 monitors how much power is available from each power source and determines how much power to supply from each power source to each subsystem which requires power. For example, if using a fuel cell stack to generate power internally, a warm-up period may be needed before the fuel cells are available. During this period, control system 1103 may direct power from an external source, if available, or the energy storage subsystem to power the mechanical controls 1111 and COTS electronics 1109 in the enclosure. When internally generated power becomes available (i.e., after the fuel cell warm-up period), then control system 1103 may decrease power output from energy storage subsystem 1113 and external power source 1105.

FIG. 13 is an example of power management timeline, illustrating how the control system uses power from different sources. At time 5, the internal power source is turned on. However, in this example a warm-up period is required before the internal power source begins to generate power. Thus, between time 5 and 6, the SECU relies on power from the external power source and the storage subsystem. It should be noted that the control system may take advantage of beneficial conditions such as sunshine when using solar cells or wind when using turbines to diminish or extinguish a fuel cell to conserve fuel resources. The external power source may be, for example, a solar panel, which is available in varying capacity. At time 6, the internal power source becomes available and the control system begins to use power output from the internal source in combination with power from the external source. The controller knows the SECU power needs, knows what is available from the solar source and can draw an optimal fuel cell power level supplementing natural variances from the source with power from the storage subsystem so that the averages from all sources is a steady supply of electric power for mechanical controls and COTS electronics. Any excess power may be used to replenish the energy storage subsystem, keeping it at optimal reserve.

Figure 6:
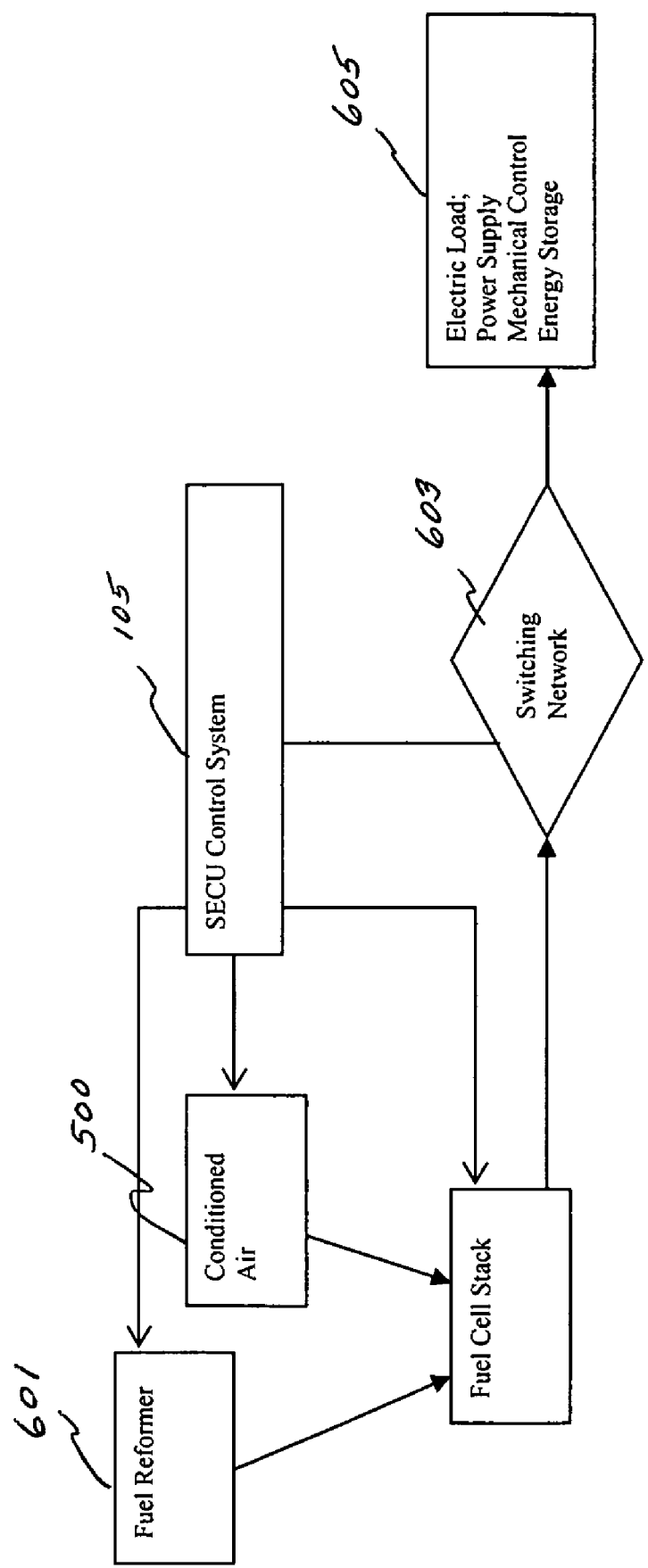
FIG. 6 is a block diagram of a stoichiometry management system according one embodiment of the invention.

As shown in FIG. 6, control system 105 controls fuel reformer 601 and conditioned air supply system 500 to control the amount of air and fuel supplied to fuel cell stack 501. In this manner, the power production of the fuel cell stack may be controlled. Electric power output by fuel cell stack 501 may then be delivered by a switching network 603 to an electrical load 605, which may include a power supply subsystem, mechanical controls, or energy storage subsystem.

On power-up, SBC 403 may be powered by an energy storage system 113, which will be discussed below in greater detail. Upon power-up SBC 403 may determine if the SECU has been set by an operator, for example, using user interface 405, to use internal or external power. If the SECU is set to use external power, SBC 401 will use sensor subsystem 409 to determine if the power quality is good. If the power quality is good, SBC 401 will power-up the environmental controls 107. If the power quality is not good, SBC 401 will inform the operator of the poor power quality using user interface 405.

If the operator has set the SECU to use internal power via user interface 405, power from the energy storage subsystem may be used to start operation. If insufficient power is available, the operator may connect an external emergency power source 417 to the energy storage subsystem. External emergency power source 417, may be for example, a battery of sufficient capacity. Once the control system is powered up, sensors may collect data so that environmental controls 107 may begin operating.

It is important that the sensors collect data before operation of the electronic devices in the enclosure so that the electronics may not begin operation if the environmental conditions of the enclosure are not suitable for operation of the electronic equipment. For example, if the temperature of the enclosure is above the maximum permissible temperature, powering up the electronic devices may destroy the device before the environmental controls are given sufficient time to cool the enclosure.

Control system 105 may then look at the last sensor values stored in memory and compare these values to the current conditions. If the last sensor values were good, control system 105 may set the SECU from those settings. If the sensor values were not good, then those settings may be avoided.

Figure 7:
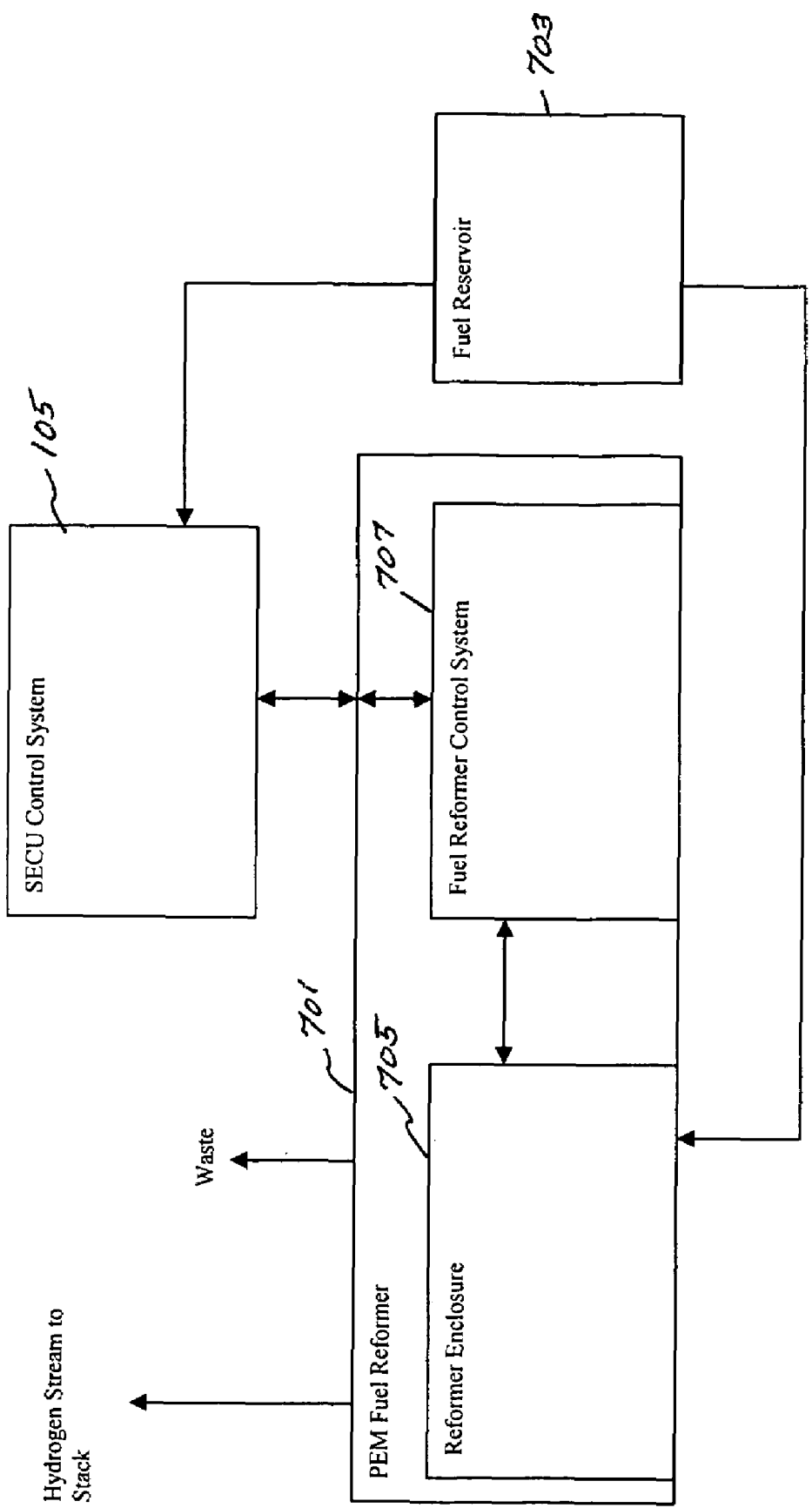
FIG. 7 is a block diagram of a fuel subsystem according to one embodiment of the invention.

If sensor measurements are good and the SECU is set to use internal power, control system 105 may then start fuel system 101. As shown in FIG. 7, fuel system 101 may include a fuel storage reservoir 703 and a fuel reformer 701. Fuel system 101 is checked to see if there is enough fuel to start and continue operation of the SECU. The fuel reformer may be used to convert primary fuel to an intermediate form suitable for use by the power source (e.g., a fuel cell). For example if using a PEM fuel cell, the fuel reformer may convert a liquid or gaseous fuel to a pure hydrogen gas for use by the fuel cell. Fuel reformer 701 may break down the fuel by mixing it with steam at a certain pressure and temperature in reformer enclosure 705 to break the fuel into a hydrogen stream, carbon monoxide, and water vapor. The concentration of impurities in the hydrogen stream can be controlled by the pressure and temperature of gases in reformer enclosure 705 and the flow rate of gases into reformer enclosure 705. Such parameters may be controlled by reformer control system 707 via control system 105. Sensors in the fuel reformer monitor the byproducts of the fuel reformation process to ensure that any impurities in the fuel supplied to the power source are within acceptable tolerances and that the fuel supplied to the power source is at an appropriate temperature and pressure. It should be appreciated that a fuel reformer may not be necessary. For example, if using a DMFC, it may not be necessary to use a fuel reformer. Fuel system 101 may also include a waste level management subsystem. As mentioned above, the fuel reformer may generate waste water and impurities such as carbon monoxide. The fuel reformer may also generate excess heat produced during reformation of fuel. Moreover, the fuel cell stack may also generate waste water and excess heat. A waste level management subsystem, shown in FIG. 8, may be provided to discharge waste and put the excess heat and water to use for the SECU.

Figure 8:
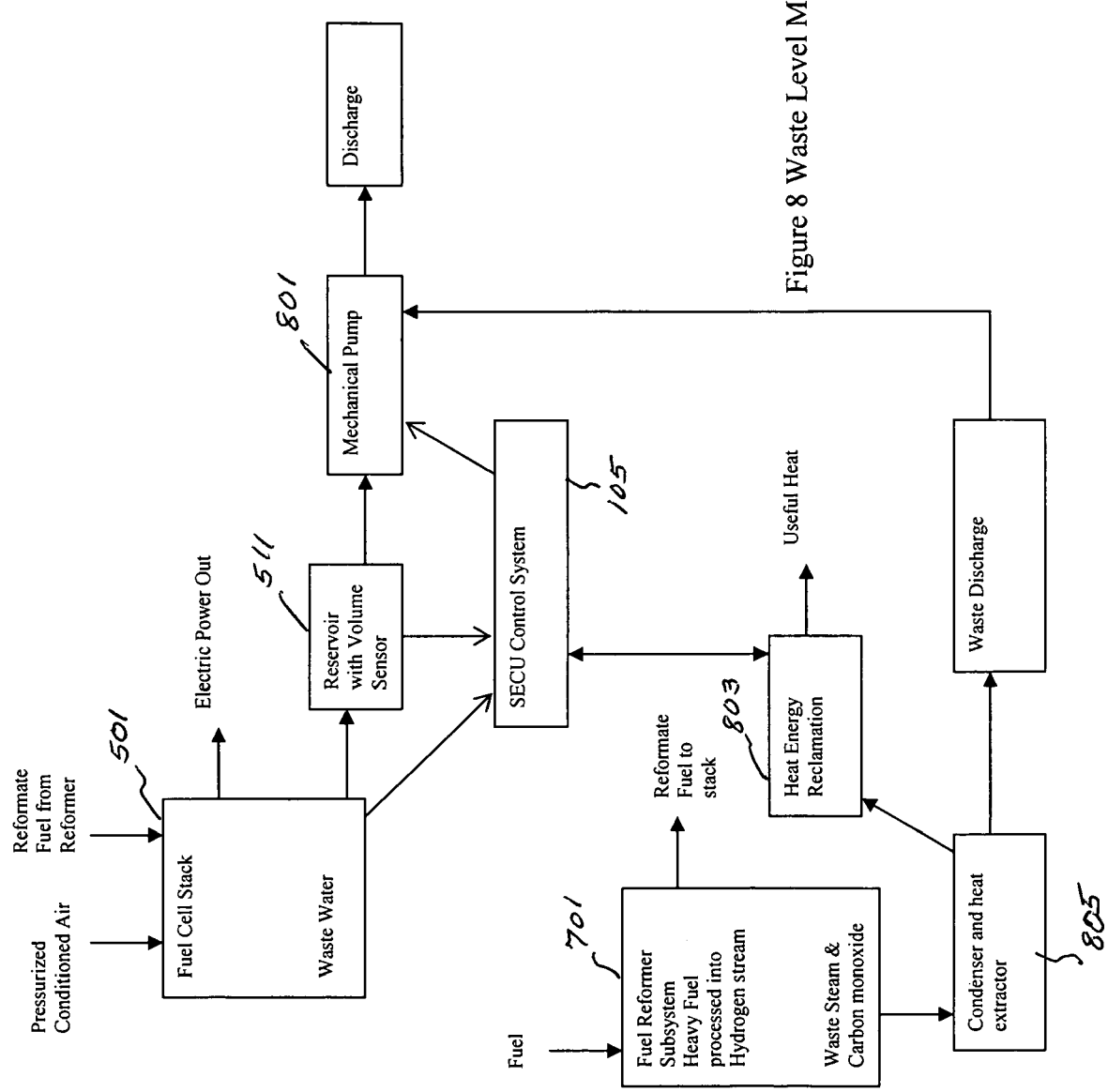
FIG. 8 is a block diagram of a waste management subsystem according to one embodiment of the invention.

As shown in FIG. 8, fuel stack 501 receives air and fuel and generates electric power and waste water. The waste water may be stored in a humidification reservoir 511 used to humidify the air provided to the fuel cell stack or enclosure of the SECU. A mechanical pump 801 may pump excess water from humidification reservoir 511 and discharge the water. Likewise, fuel reformer 701 receives fuel and generates as byproducts steam and carbon monoxide. A condenser and heat extractor 805 may condense the steam to water, where it may be provided to humidification reservoir 511 or discharged. The heat energy may be reclaimed and provided to heat energy reclamation block 803 where it may be distributed to other subsystems or enclosure 109.

Next, control system 105 may open a pressure regulator to send the fuel from fuel system 101 to power production system 103. Power production system 103 includes the internal power source or power sources for the SECU. For example, power production system 103 may include a stack of fuel cells. Alternatively, if an internal power source of the SECU is wind power, power production system 103 may include a wind turbine. Control system 105 may then set up power source selection subsystem 411 to transfer power produced by power production system 103 to energy storage subsystem 413.

Figure 9:
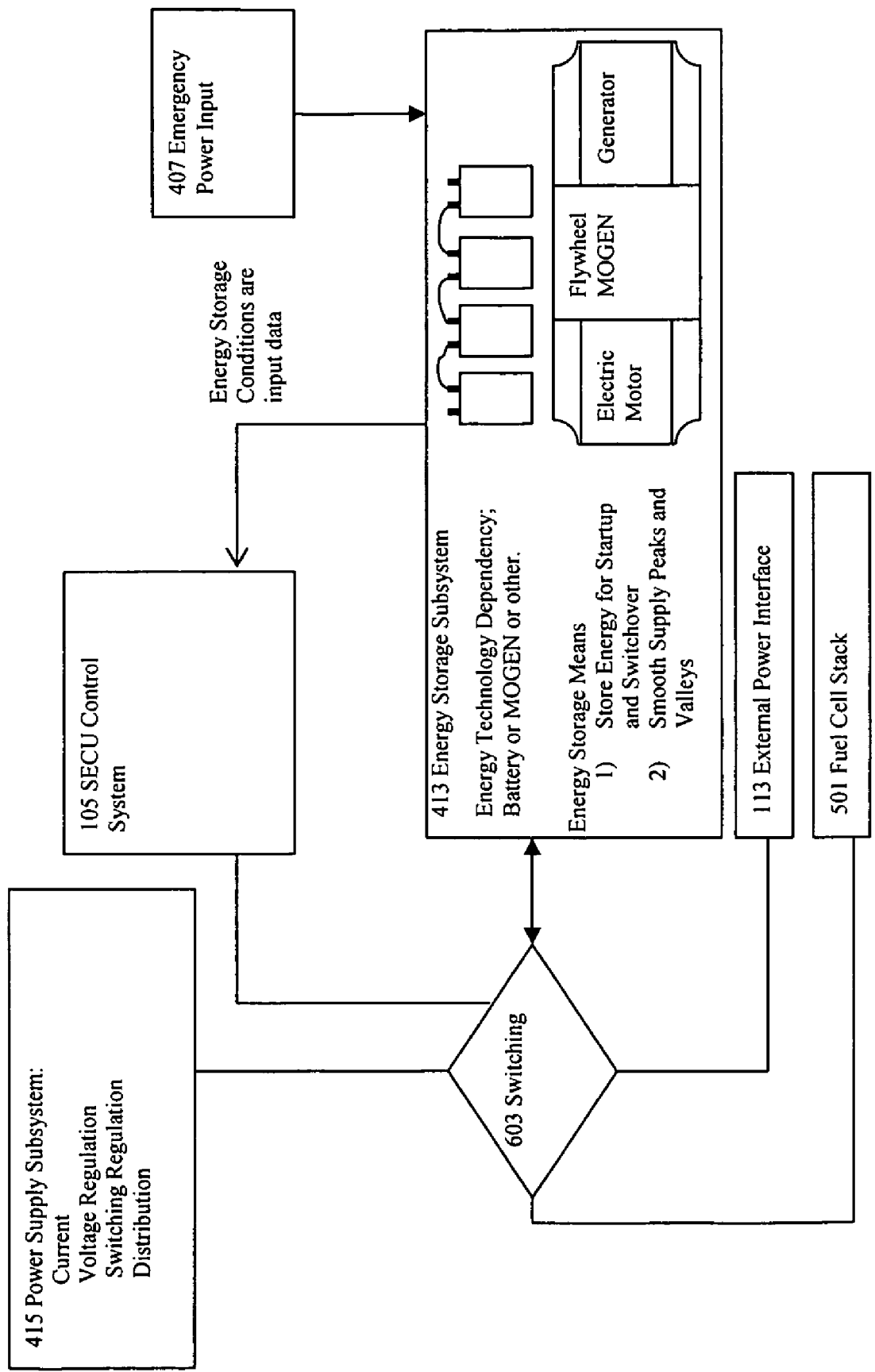
FIG. 9 is a block diagram of an energy storage subsystem according to one embodiment of the invention.

FIG. 9 illustrates an example of an energy storage system according to one embodiment of the invention. Energy storage system 413 may perform several functions. First, it may store energy produced by power production system 103. Energy storage system may use any type of energy storage device such as lead acid batteries, nickel cadmium batteries, metal hydride batteries, a high speed motor which stores electrical energy as rotational mechanical energy, a large capacitor bank, or a motor compressor which stores energy in the form of compressed air and uses a turbine to convert the energy back to electrical form. It should be appreciated that any type of energy storage device may be used and the invention is not limited in this regard. Second, the energy storage system supplies power to power supply subsystem 415. Sometimes, the internal power source takes a while to reach its designated output power level. For example, a fuel cell may take some time before it is brought to full power. Thus, energy storage subsystem 413 provides power to power supply subsystem 415 while the power source is started up and buffers the power received from the power source so that power supply subsystem 415 receives a smooth and continuous flow of power. Another function provided by the energy storage system is buffering a wide DC voltage range generated by the power production device to a more narrow DC voltage range suitable for the power supply subsystem. Another function that may be provided by the energy storage system is conversion of DC voltage to an AC voltage. Power supply subsystem 415 includes switching and voltage regulation for final power conditioning as needed by COTS electronics. Control system 105 may monitor how much energy is stored and direct energy to and from energy storage system 413 through switching network 603. Power input 407 allows storage of energy when internally generated power is not available.

Figure 10:
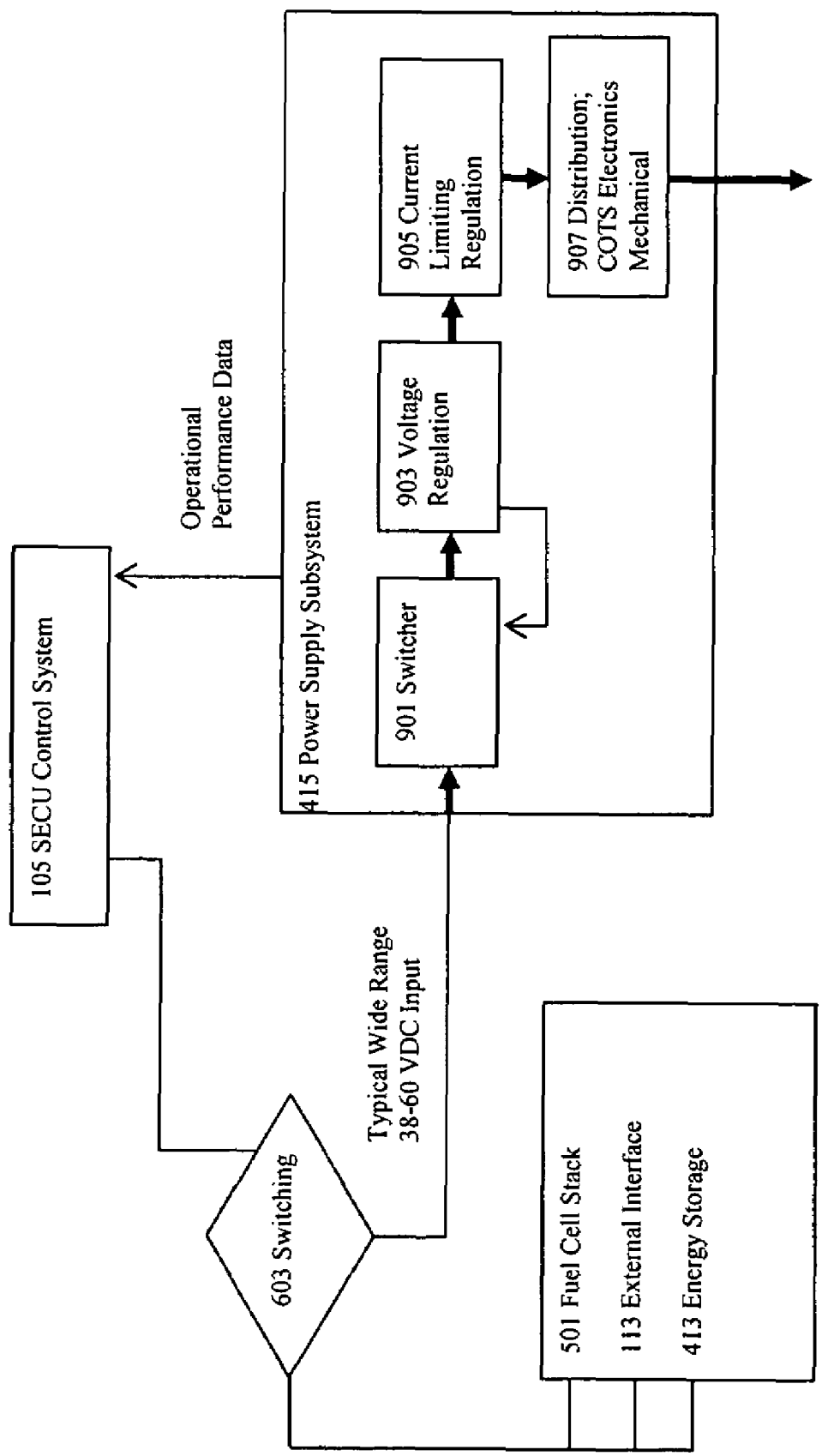
FIG. 10 is a block diagram of a power supply subsystem according to one embodiment of the invention.

Power supply system 415 supplies power to enclosure 109 for powering electronic devices housed in the enclosure and provides power to environmental controls 107 for powering controls, such as compressors, pumps or fans, which use electricity. As shown in FIG. 10, power supply system 415 also performs voltage regulation of power received from an energy source 909. Energy source 909 may be, for example, an energy storage subsystem 413, an external power source 113, or a fuel cell stack 501. Switching subsystem 603 may be used to route the power produced by the various sources to subsystems which require power, as directed by the SECU control system 105. For example, power supply subsystem 415 may receive, for example, a voltage between 38 and 60 volts from the fuel cell stack of power production subsystem 103, an external power source, or energy storage subsystem. Switching regulator 901 may convert the input voltage to 48 volts DC. Voltage regulator 903 may be used to maintain a smooth supply voltage. Voltage regulator 903 may also be used to keep the supply voltage within tolerances when electrical loads are switched on and off. For example, starting an electric motor can cause a sudden current inrush, which will diminish as the motor comes up to rotational speed. Voltage across the motor may dip momentarily as a result of this inrush of current. Power supply system 415 may also include current limiters 905, such as fuses or circuit breakers to prevent damage to devices in environmental controls 107 or in enclosure 109.

Figure 11:
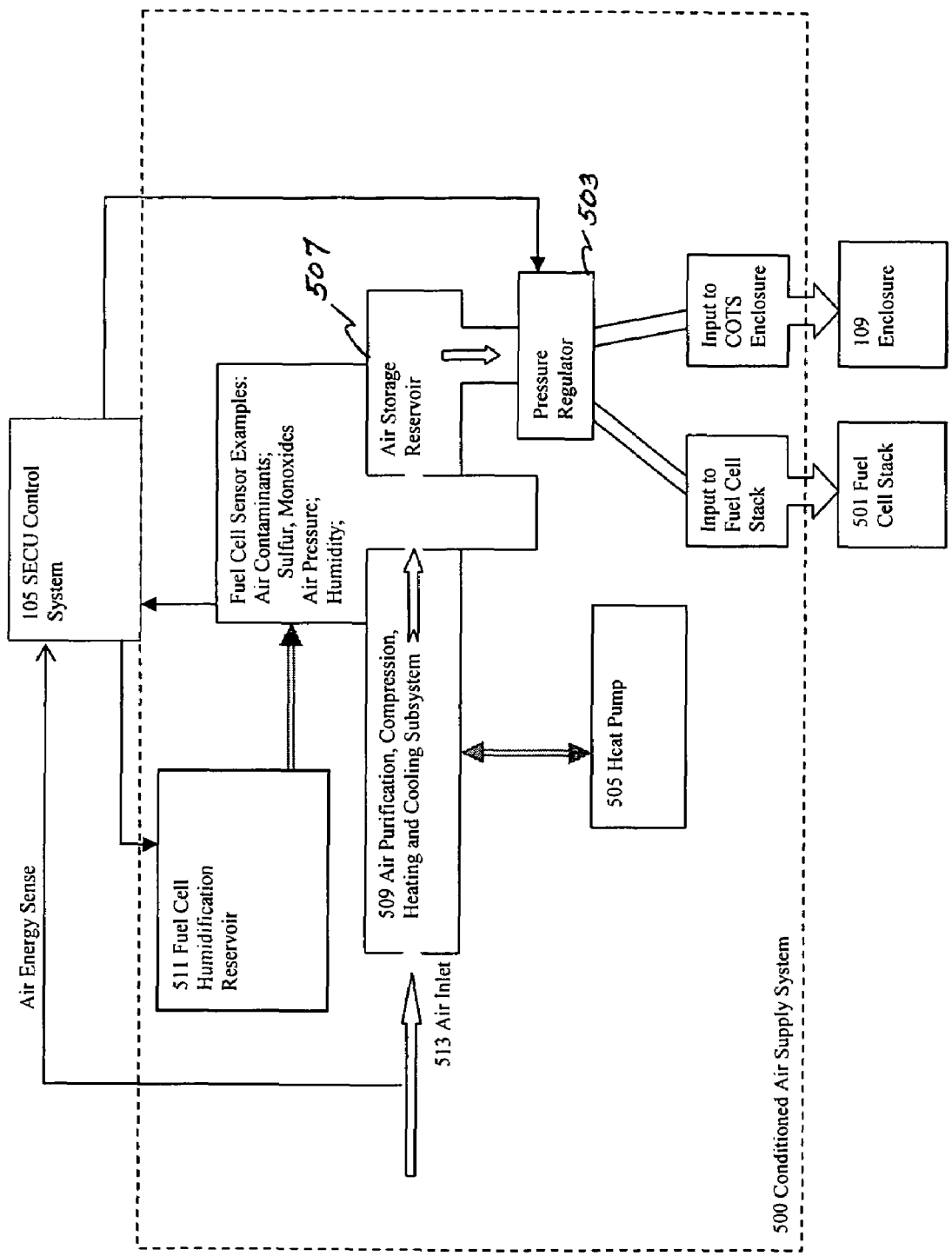
FIG. 11 is a block diagram of a conditioned air supply system according to one embodiment of the invention.

Environmental controls 107 includes mechanical controls which are used to control the environmental conditions of enclosure 109. For example, environmental controls 107 may include a conditioned air supply system 500, shown in FIG. 11, which provides air to the fuel cell stack and enclosure 109. If the temperature of the outside air can safely cool enclosure 109, that air may enter enclosure 109 directly, bypassing conditioned air supply system 500. Air purification, compression, heating, and cooling block 509 serves to adjust the temperature of the air using a heat pump 505. Heat pump 505 may be a reversible heat pump so that incoming air may be either heated or cooled. Alternatively, waste heat generated by the fuel cell stack or the fuel reformer may be used to heat the air. This waste heat may be used in conjunction with the heat pump to control temperature of the air. The standard operational profile may include quantities of waste thermal energy expected to be generated by the fuel cell stack and fuel reformer at a particular power level. This data may be used in deciding when and for how long the heat pump should operate. It should be appreciated that COTS electronics may need to be cooled during the course of operation, as excess heat is produced. In the situation where the SECU is used in winter or arctic-like conditions, then the heat produced may not be sufficient to keep the COTS equipment at operational temperature. In this situation, the SECU controller 105 may anticipate the needed heat and arrange the component subsystems for efficient transfer of waste heat to the COTS electronics.

Block 509 also includes a series of filters to remove elements, such as sulfur compounds and carbon monoxide, that may be harmful to the fuel cell stack. Air may be stored in air storage reservoir 507 for use by the fuel cell stack and enclosure 109. Because air may need to be conditioned differently for the fuel cell stack and enclosure 109, air storage reservoir 507 may have sub-enclosures within the main storage reservoir for air designated for the fuel cell stack. Alternatively, temperature of air in enclosure 109 may be controlled using an isolated heat exchanger, as described by Vos, et. al., in U.S. Pat. No. 6,330,152. Humidification reservoir 511 may store water to humidify the air. Humidification reservoir 511 may be controlled by control system 105 to add humidity to air in either block 509 air storage reservoir 507. Pressure regulator 503 is under the control of control system 105 and regulates the pressure of the air going to fuel cell stack 501 and enclosure 109. Such pressure regulation may be particularly useful when, for example, the SECU is used at high elevations (e.g., in airplanes).

Having thus described illustrative embodiments of the invention, various modifications and improvements will readily occur to those skilled in the art and are intended to be within the scope of the invention. According, the foregoing description is by way of example only and is not intended as limiting. The invention is limited only as defined in the following claims and the equivalents thereto.

What is claimed is:

1. A portable apparatus for housing an electronic device, comprising:
   an environmentally sealed chamber having environmental conditions therein, wherein the chamber is adapted to receive the device;
   environmental controls that control the environmental conditions;
   at least two different types of self-contained power sources, each of which is adapted to generate power for operating the device; and
   a digital controller for monitoring the environmental conditions of the chamber and for selectively activating and deactivating the environmental controls to control the environmental conditions, wherein the digital controller is configured to regulate power generated by at least one of the self-contained power sources.

2. The portable apparatus for housing the electronic device, as recited in claim 1, wherein the at least two different types of self-contained power sources include a fuel cell and at least one of a wind turbine and solar panels.

3. The portable apparatus for housing the electronic device, as recited in claim 1, wherein the at least two different types of self-contained power sources include at least one of a permeable exchange fuel cell, a solid oxide fuel cell and a direct methanol fuel cell.

4. The portable apparatus for housing the electronic device, as recited in claim 1, wherein the at least two different types of self-contained power sources are direct current devices having low electromagnetic radiation.

5. The portable apparatus for housing the electronic device, as recited in claim 1, wherein the at least two different types of self-contained power sources cooperate to generate power for operating the device by collectively supplying a steady supply of electric power to the electronic device.

6. A portable apparatus for housing an electronic device, comprising:
   an environmentally sealed chamber having environmental conditions therein, wherein the chamber is adapted to receive the device;
   environmental controls that control the environmental conditions;
   at least two different types of self-contained power sources, each of which is adapted to generate power for operating the device;
   a digital controller for monitoring the environmental conditions of the chamber and for selectively activating and deactivating the environmental controls to control the environmental conditions; and
   a plurality of sensors configured to detect environmental conditions and provide information regarding the environmental conditions to the digital controller.

* * * * *